United States Patent
Avanzino et al.

(10) Patent No.: US 6,291,339 B1
(45) Date of Patent: Sep. 18, 2001

(54) BILAYER INTERLAYER DIELECTRIC HAVING A SUBSTANTIALLY UNIFORM COMPOSITE INTERLAYER DIELECTRIC CONSTANT OVER PATTERN FEATURES OF VARYING DENSITY AND METHOD OF MAKING THE SAME

(75) Inventors: Steven C. Avanzino, Cupertino; Simon S. Chan, Saratoga, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/225,218

(22) Filed: Jan. 4, 1999

(51) Int. Cl.[7] .................. H01L 21/4263; H01L 21/44

(52) U.S. Cl. .................. 438/633; 438/634; 438/670; 438/572

(58) Field of Search .................. 438/690, 633, 438/672, 634, 752, 763, 670, 671, 688, 700

(56) References Cited

U.S. PATENT DOCUMENTS

| | | |
|---|---|---|
| 5,354,712 | 10/1994 | Ho et al. . |
| 5,550,405 * | 8/1996 | Cheung et al. ............... 257/642 |
| 5,674,781 * | 10/1997 | Huang et al. ............... 437/192 |
| 5,693,563 | 12/1997 | Teong . |
| 5,880,018 * | 3/1999 | Boeck et al. ............... 438/619 |
| 5,946,600 * | 8/1999 | Hurwitz et al. ............... 438/688 |
| 6,080,529 * | 6/2000 | Ye et al. ............... 430/318 |
| 6,127,089 * | 10/2000 | Subramanian et al. ............... 430/270 |
| 6,153,514 * | 11/2000 | Wang et al. ............... 438/640 |

* cited by examiner

Primary Examiner—Michael Lebentritt

(57) ABSTRACT

A bilayer interlayer dielectric having a spun-on low k gap filled layer is capped with a higher k dielectric layer. Prior to the capping, the spun-on low k dielectric layer is planarized to reduce or eliminate the systematic variation in the relative thickness of the layers due to pattern density effects on the thickness of the spun-on low k dielectric layer. By removing the variations in the relative thickness of the low k dielectric layer and the capping layer, the effective dielectric constant of the uniformly thick composite interlayer dielectric is independent of location on the circuit, preventing differences in circuit speed and the creation of clock skew in the circuit.

13 Claims, 2 Drawing Sheets

BILAYER INTERLAYER DIELECTRIC HAVING A SUBSTANTIALLY UNIFORM COMPOSITE INTERLAYER DIELECTRIC CONSTANT OVER PATTERN FEATURES OF VARYING DENSITY AND METHOD OF MAKING THE SAME

FIELD OF THE INVENTION

The present invention relates to the formation of an interlayer dielectric during the manufacture of semiconductor devices, and more particularly, to the controlling of the composite interlayer dielectric constant of a bilayer interlayer dielectric.

BACKGROUND OF THE INVENTION

The escalating requirements for high-density and performance associated with ultra large-scale integration semiconductor wiring require responsive changes in interconnection technology. Such escalating requirements have been found difficult to satisfy in terms of providing a low RC (resistance-capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines may be formed on top of a substrate or in trenches which typically extend substantially horizontal with respect to the semiconductor substrate. Semiconductor "chips" comprising five or more levels of metallization are becoming more prevalent as device geometries shrink to sub-micron levels.

In efforts to improve the operating performance of a chip, low k dielectric materials have been increasingly investigated for use as replacements for dielectric materials with high k (i.e. dielectric constant values). Lowering the overall k values of the dielectric layers employed in the metal interconnect layers lowers the RC-delay of the chip and improves its performance. However, low k materials, such as benzocyclobutene (BCB), hydrogen silsesquioxane (HSQ), SiOF, and the material sold under the tradename of FLARE, are often more difficult to handle than traditionally employed higher k materials, such as silicon dioxide. For example, when traditional methods of patterning dielectrical layers are employed, special steps must be taken to protect the low k dielectric layer material from unintended etching. For example, a photoresist layer that is used to pattern a low k dielectric layer is usually removed by oxygen ashing or solvents. However, this type of removal of the photoresist layer also typically reacts with the low k dielectric layer to undesirably remove some of or chemically alter the low k dielectric layer. To prevent this occurrence, a capping layer made of a different material than the low k dielectric layer is employed to protect the low k dielectric layer in subsequent processing steps, such as etching.

The formation of such a bilayer interlayer dielectric as described above (i.e., a low k dielectric layer and a capping layer) has some attendant difficulties. More particularly, as described below with respect to FIGS. 1–3 depicting a prior art process of forming a bilayer interlayer dielectric, it is difficult to achieve a consistent composite dielectric constant for the interlayer dielectric. This leads to differences in circuit speed and clock skew.

In FIG. 1, the semiconductor wafer 10, during a stage of manufacturing, has a substrate 12 upon which conductive material (e.g., a metal) is patterned. This pattern may be created, for example, by deposition of a metal, such as aluminum or copper, followed by a patterning and etching away of the metal to leave metal lines and other structures that are desired. Over the surface of the substrate 12, the metal exhibits different pattern densities. For example, a single metal line 14 is depicted on the left hand side of FIG. 1. A somewhat more dense pattern of metal is represented by reference numeral 16. A wide metal or dense metal pattern is depicted with reference numeral 18 on the right hand side of FIG. 1. These patterns represent different areas of the semiconductor device provided on the semiconductor wafer 10.

A first dielectric layer 20 is then spin-coated on the substrate 12 in a non-conformal manner to completely cover the metal regions 14, 16 and 18. Examples of suitable low k material (i.e. k less than 4) include HSQ, FLARE, BCB and others. As can be seen from the schematic depiction of FIG. 2, the thickness of the spun-on low k dielectric layer 20 varies systematically across the metal pattern as a function of the local pattern density of the metal. Hence, the thickness of the low k dielectric layer 20 is much greater over the wide metal (densest) pattern region 18, and thinner over the less dense metal regions 14 and 16. This variation in the thickness of the non-conformally spun-on low k dielectric layer 20 over different pattern density regions is a characteristic of this class of dielectric materials and the spinning-on process.

When a capping layer 22, such as an oxide, is deposited over the low k dielectric layer 20 as depicted in FIG. 3, and subsequently planarized as normally done in semiconductor processing, the relative thicknesses of the low k dielectric layer 20 and the capping layer 22 varies systematically due to the pattern density effects. For example, in the right hand side of FIG. 3, the ratio of the thickness of the low k dielectric layer 20 to the thickness of the capping layer 22 is much greater over the dense metal region 18 than over the less dense regions 14 and 16. Due to the relatively greater amount of low k material in this region 18 relative to the higher k material in the capping layer 22, the composite dielectric constant in the dense metal region 18 will be lower than in the less dense metal regions 14, 16.

The variation in the composite dielectric value over the integrated circuit has an effect on the RC in the different locations of the circuit. For example, in the dense metal regions 18 where the composite dielectric constant is lower, the RC will also be lower and the circuit will be faster than in the less dense metal regions 14, 16, where the composite dielectric constant for the interlayer dielectric is greater. These different circuit speeds over a device create clock skew in the device.

There is a need for a bilayer interlayer dielectric that achieves the advantages of reducing the overall dielectric constant of an interlayer dielectric by employing low k materials, but avoids the creation of clock skew in a device that results from differences in circuit speed.

SUMMARY OF THE INVENTION

This and other needs are met by the present invention which provides a method of forming a composite interlayer dielectric in which a first layer of a first dielectric material is formed over a substrate layer having patterned features. The first layer is planarized and a second layer of a second dielectric material is formed over the planarized first layer. Either the first dielectric material or the second dielectric material is a low k material, while the other dielectric material is a higher k dielectric material with a dielectric constant equal to or greater than 4.

In preferred embodiments of the present invention, the first dielectric material is made of the low k material and spin-coated on over the substrate layer. The planarization of this layer prior to the formation of a second layer, serving as a capping layer, substantially equalizes the height or thickness of the spun-on low k layer over the different density metal regions. Hence, when the capping layer is deposited over the planarized low k layer, the ratios of the thickness of the low k to the thickness of the capping layer will remain substantially constant in the different density metal regions. The composite dielectric constant of the bilayer interlayer dielectric of the present invention does not exhibit substantial variation over the device. This prevents undesirable differences in circuit speed and creation of clock skew.

The earlier stated needs are also met by embodiments of the present invention which provide an arrangement comprising a substrate layer having patterned features including high density regions and low density regions. A first layer of low k dielectric material is formed on the substrate layer. A second layer of dielectric material is provided on the first layer. The first and second layers form a composite interlayer dielectric with an effective dielectric constant that is substantially the same value at the high density regions and at the low density regions.

This arrangement in which the first and second layers form a composite interlayer dielectric with a substantially invariant effective dielectric constant, provides the advantage of reducing the overall dielectric constant of an interlayer dielectric by employing a low k dielectric material. It also avoids the handling problems inherent in using a low k dielectric material by providing a capping layer. Since the effective dielectric constant is substantially the same value at the high density regions and the low density regions, variations in circuit speed and the creation of clock skew is prevented. In certain embodiments of the invention, the first layer of low k dielectric material has a substantially planar top surface. This prevents variations in the thickness of the first layer of dielectric material over the integrated circuit When the second layer of dielectric material is provided on the first layer of low k dielectric material with the substantially planar top surface, the relative thicknesses of the two layers over the high density regions and low density regions of the substrate layer will be relatively constant over the entire integrated circuit.

The earlier stated needs are also met by another embodiment of the present invention which provides a method of forming a bilayer interlayer dielectric over a substrate layer having patterned features of high density and of low density. The bilayer interlayer dielectric has substantially the same effective dielectric constant over the high density pattern features and the low density pattern features. The method of the invention includes forming a low k dielectric layer over the substrate layer with substantially uniform thickness over the high density pattern features and the low density pattern features. A cap layer is formed over the low k dielectric layer, with the low k dielectric layer and the cap layer forming a bilayer interlayer dielectric. In certain embodiments of the present invention, the low k dielectric layer is formed with substantially uniform thickness by spin-coating a low k dielectric material over the substrate layer and then planarizing the low k dielectric material.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

DETAILED DESCRIPTION OF THE INVENTION

The present invention solves problems associated with the formation of a bilayer interlayer dielectric that has a low k dielectric layer as the first layer formed over metal patterns of varying density. When spin-coating on a low k dielectric layer over a patterned metal layer, the thickness of the spun-on layer varies as a function of the pattern density of the metal. This variation in thickness causes a variation (following deposition of a capping layer) in the composite dielectric constant in the bilayer interlayer dielectric at the different locations of the integrated circuit depending upon the local pattern density. The present invention avoids the variant composite dielectric values by planarizing the spun-on low k dielectric layer prior to the deposition of a capping layer. This planarization substantially equalizes the thicknesses of the low k dielectric layer over the different density metal regions. Hence, when the dielectric material is deposited over the spun-on and planarized low k dielectric layer, the relative thicknesses of the low k dielectric layer and the capping layer remains relatively constant throughout the device, regardless of the pattern density. This prevents the different locations of the integrated circuit from having different circuit speeds and creating clock skew.

Figure 1:
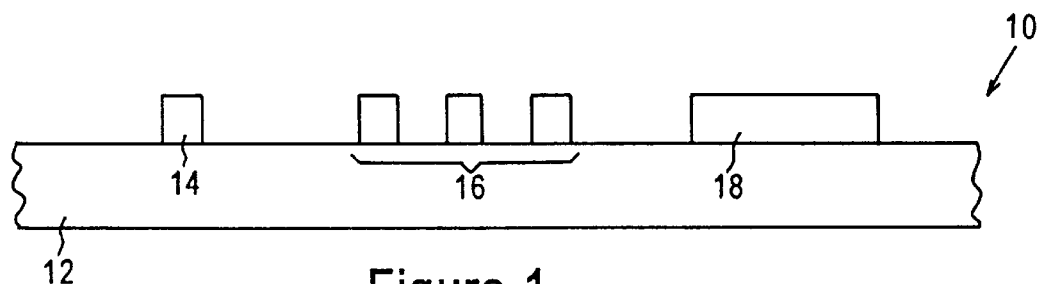
FIG. 1 is a schematic cross-section of a portion of a semiconductor wafer following a manufacturing step in accordance with the prior art.
Figure 2:
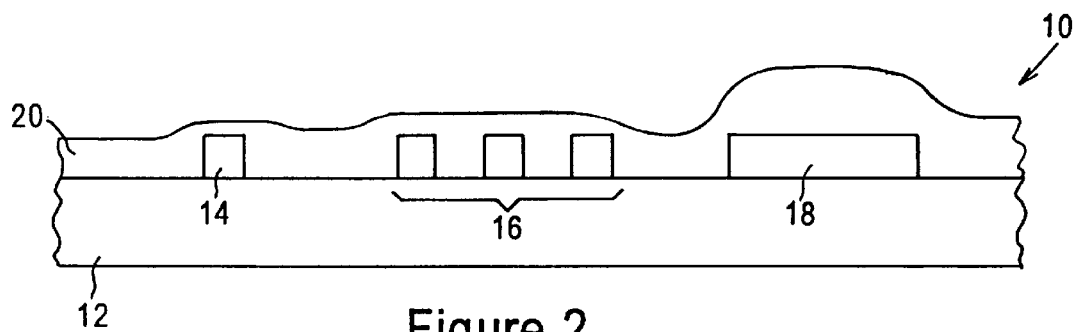
FIG. 2 is a cross-section of the portion of FIG. 1 after spin-coating on of a low k dielectric layer over the substrate and metal patterned features in accordance with the prior art.
Figure 3:
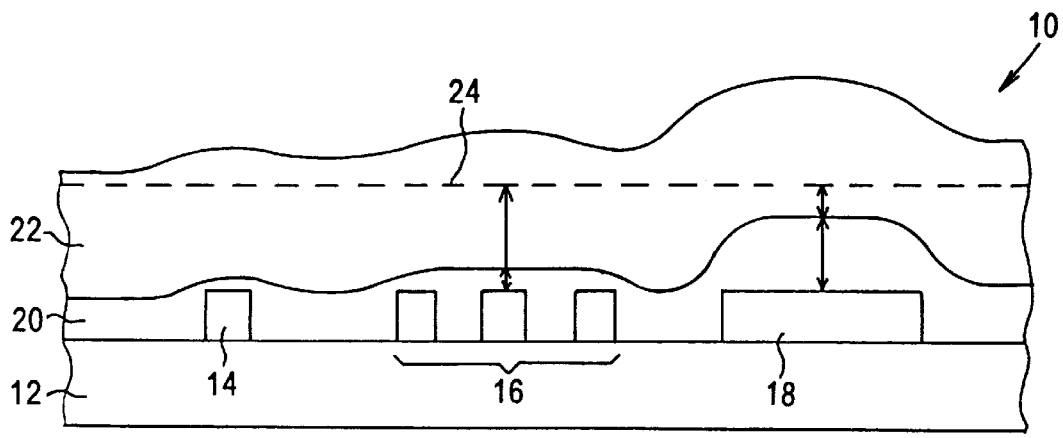
FIG. 3 is a cross-section of the portion of FIG. 2 following the deposition of a dielectric material on the low k dielectric layer in accordance with prior art methods of manufacturing.
Figure 4:
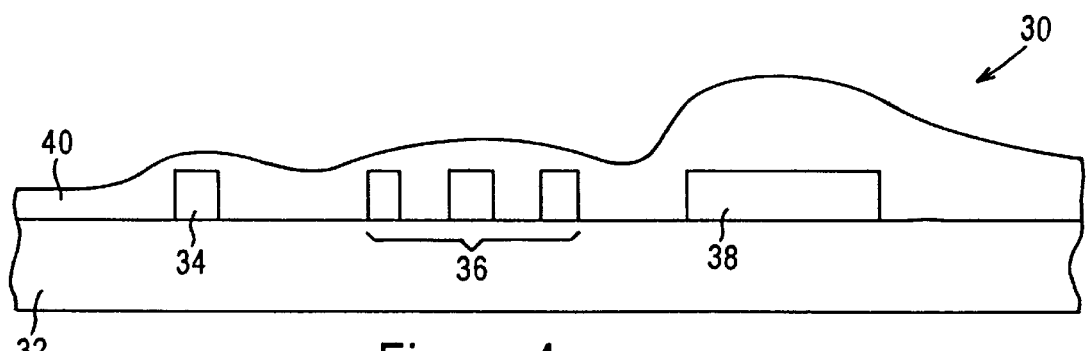
FIG. 4 is a cross-section of a portion of a semiconductor wafer manufactured in accordance with embodiments of the present invention, during a stage of manufacturing in which a low k dielectric layer has been spun-on over a substrate layer having patterned features.

FIG. 4 is a cross-section of an interlayer dielectric portion of a semiconductor device during one step of the manufacturing process. The step represents the same manufacturing step as depicted in FIG. 2 of the prior art method. A semiconductor wafer 30 has a substrate layer 32 upon which pattern features 34, 36 and 38 are provided. As in the prior art, the pattern features 34, 36, 38 can be formed by depositing a metal, such as aluminum or copper, and then masking and etching the undesired material away, leaving the pattern depicted in FIG. 4. Such creation of pattern features by depositing, masking and etching are well known. The various patterns 34, 36, 38 exhibit different pattern densities. For example, the single metal feature 34 has the lowest density; the wide metal region 38 has the greatest density, and the region 36 has an intermediate pattern density. A layer of low k dielectric material 40 is spin-coated on over the patterned features 34, 36, 38 of the substrate 32. Such techniques are well known in the art. The low k dielectric material (i.e. k less than 4) may be made of a material such as as benzocyclobutene (BCB), hydrogen silsesquioxane (HSQ), or FLARE, as examples. In certain embodiments of the present invention, a curing is performed after the spinning-on of the low k dielectric material.

As is apparent from the depiction of the portion of FIG. 4, the thickness of the low k dielectric layer 40 varies in dependence upon the density of the regions over which it is spun on. For example, the low k dielectric layer 40 is thickest over the densest metal region 38, and is relatively thinner over the lower density metal regions 34, 36. The variations in thicknesses is caused by the inherent properties of the low k dielectric materials and the spinning-on process employed in forming a low k dielectric layer.

Figure 5:
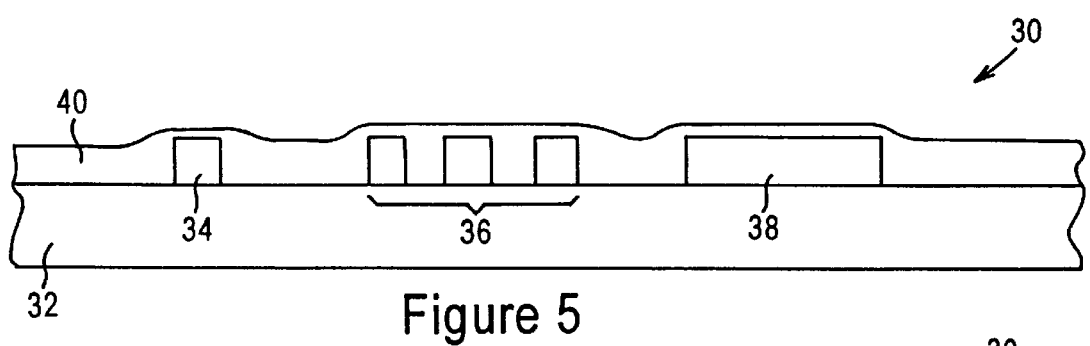
FIG. 5 is a cross-section of a semiconductor wafer portion of FIG. 4, following the planarization of the low k dielectric layer in accordance with embodiments of the present invention.

The present invention avoids the problems of the prior art caused by the uneven thicknesses in the low k dielectric layer 40 by planarizing this layer. FIG. 5 depicts the portion of FIG. 4 after a planarization step is performed to substantially even out the thicknesses of the low k dielectric layer 40 over the different density regions 34, 36, 38. The planarization may be a chemical mechanical polish (CMP) planarization step, for example. In conventional CMP planarization, a reactive agent in a slurry reacts with the surface of the layer to be polished, and the abrasive particles mechanically remove the undesired material. The interaction of the polishing pad, abrasive particles, and reactive agent with a layer to be polished, results in a polishing.

In the present invention, the polishing materials and processing conditions are tailored to the specific low k material used, as well understood by those of skill in the art, to effect the best planarizing efficiency. In this way, the protruding thicker regions of low k material in the wide metal or dense metal areas are removed at a faster rate than in the recessed areas. This is accomplished through conventional CMP planarization by using the polishing materials and processing conditions known to those of skill in the art.

Figure 6:
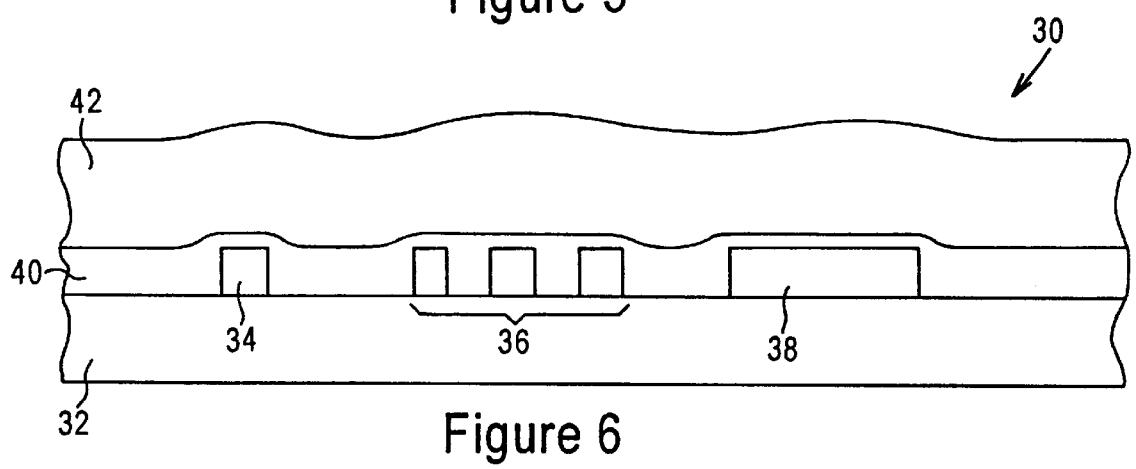
FIG. 6 is a cross-section of a portion of FIG. 5 after the deposition of a dielectric layer over the planarized low k dielectric layer, in accordance with embodiments of the present invention.

FIG. 6 depicts the portion of FIG. 5 after a conformal deposition of a capping layer 42. The capping layer 42 may be made of silicon dioxide, for example. The silicon dioxide may be deposited by plasma-enhanced chemical vapor deposition (PECVD) in preferred embodiments. Following the deposition of the capping layer 42, a second planarization step, such as CMP planarization, is performed on the capping layer 42 to prepare the composite interlayer dielectric for further processing steps. The resulting structure is depicted in FIG. 7.

Figure 7:
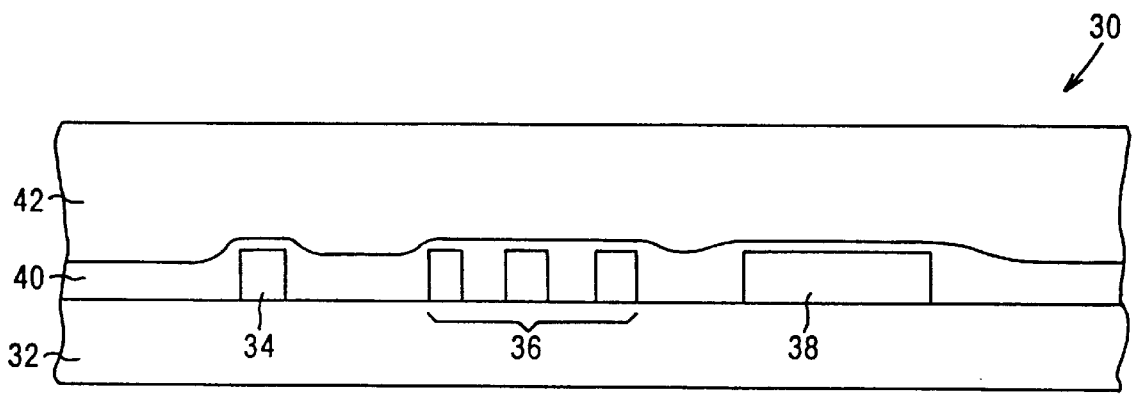
FIG. 7 depicts the cross-section of the portion of the semiconductor wafer in FIG. 6 following the planarization of the dielectric layer to form a bilayer interlayer dielectric in accordance with embodiments of the present invention.

The planarization of the low k dielectric layer 40 prior to the deposition and planarization of the capping layer 42 creates a structure, as shown in FIG. 7, in which the relative thicknesses of the low k dielectric 40 and the capping layer 42 remain substantially invariant in the different locations of the circuit. This relationship holds true regardless of the pattern density of the metal regions 34, 36, 38. Since the relative thicknesses are substantially invariant, the effective dielectric constant is independent of location on the circuit. At the same time, a uniformly thick composite bilayer interlayer dielectric is created with a lower dielectric constant than a single layer made of conventional dielectric material. Hence, while the overall dielectric constant is reduced by employing a low k dielectric material as one layer in the bilayer interlayer dielectric, a consistency in the effective dielectric constant throughout the different locations of the circuit is also achieved with the present invention.

Although the present invention has been described and illustrated in detail, it is to be clearly understood that the same is by way of illustration and example only and is not to be taken by way of limitation, the spirit and scope of the present invention being limited only the terms of the appended claims.

What is claimed is:

1. A method of forming a composite interlayer dielectric, comprising the steps of:
   forming a first layer of a first dielectric material over a substrate layer having patterned features to completely cover the patterned features:
   planarizing the first layer such that the first layer remains completely covering the patterned features; and
   forming a second layer of a second dielectric material over the planarized first layer, wherein at least one of the first dielectric material and second dielectric material is a low k material with a k value less than 4, and the other of the first dielectric material and the second dielectric materials is equal to or greater than 4.

2. The method of claim 1, wherein the step of forming a first layer includes spin-coating the first dielectric material over the substrate layer, the first dielectric material being a low k material.

3. The method of claim 2, wherein the step of planarizing the first layer includes chemical mechanical polish (CMP) of the first layer.

4. The method of claim 3, wherein the patterned features include high density regions and low density regions, and the first layer is formed with thicker portions over the high density regions and thinner portions over the low density regions.

5. The method of claim 4, wherein the step of planarizing includes removing the thicker portions of the first layer at a faster rate than the thinner portions.

6. The method of claim 5, further comprising planarizing the second layer.

7. The method of claim 6, wherein the first dielectric material is selected from one of benzocyclobutene (BCB), FLARE and hydrogen silsesquioxane (HSQ).

8. The method of claim 7, wherein the second dielectric material is silicon dioxide.

9. A method of forming a bilayer interlayer dielectric over a substrate layer having patterned features of high density and of low density, the bilayer interlayer dielectric having substantially the same effective dielectric constant over the high density pattern features and the low density pattern features, comprising the steps of:
   forming a low k dielectric layer over the substantive layer with substantially uniform thickness covering the high density pattern features and the low density pattern features; and forming a cap layer over the low k dielectric layer, the low k dielectric layer and the cap layer forming a bilayer interlay dielectric wherein the step of forming a low k dielectric layer includes spin-coating on a low k dielectric material over the substrate layer and planarizing the low k dielectric material such that the first layer remains completely covering the patterned features.

10. The method of claim 9, wherein the step of planarizing includes chemical mechanical polish (CMP) to planarize the top surface of the low k dielectric layer.

11. The method of claim 10, wherein the low k dielectric material is selected from one of benzocyclobutene (BCB), FLARE and hydrogen silsesquioxane (HSQ).

12. The method of claim 11, further comprising curing the low k dielectric material prior to planarizing the low k dielectric material.

13. The method of claim 12, wherein the cap layer comprises silicon dioxide.

* * * * *